United States Patent
Wang et al.

(10) Patent No.: US 11,964,358 B2
(45) Date of Patent: Apr. 23, 2024

(54) CHEMICAL MECHANICAL POLISHING APPARATUS AND METHOD

(71) Applicant: Taiwan Semiconductor Manufacturing Co., Ltd., Hsinchu (TW)

(72) Inventors: Shang-Yu Wang, Changhua County (TW); Chun-Hao Kung, Hsinchu (TW); Ching-Hsiang Tsai, Hsinchu (TW); Kei-Wei Chen, Tainan (TW); Hui-Chi Huang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 616 days.

(21) Appl. No.: 17/206,628

(22) Filed: Mar. 19, 2021

(65) Prior Publication Data

US 2021/0205950 A1     Jul. 8, 2021

Related U.S. Application Data

(62) Division of application No. 16/572,895, filed on Sep. 17, 2019, now Pat. No. 10,953,514.

(51) Int. Cl.
*B24B 37/10* (2012.01)
*B24B 37/04* (2012.01)
*B24B 49/00* (2012.01)
*H01L 21/306* (2006.01)

(52) U.S. Cl.
CPC .......... *B24B 37/107* (2013.01); *B24B 37/042* (2013.01); *B24B 49/00* (2013.01); *H01L 21/30625* (2013.01)

(58) Field of Classification Search
CPC ....... B24B 47/12; B24B 37/107; B24B 7/228; B24B 37/27; B24B 37/30; B24B 37/32; B24B 37/042; B24B 49/00; B24B 37/34; B23Q 3/152; H01L 21/6831; H01L 21/6833; H01L 21/30625; H01L 21/67092; H01L 21/76819; H01L 21/7684
USPC ............ 451/9, 285, 286, 287, 288, 290, 398
See application file for complete search history.

(56) References Cited

U.S. PATENT DOCUMENTS

| | | | |
|---|---|---|---|
| 6,234,868 B1 * | 5/2001 | Easter | ..... B24B 49/16 451/72 |
| 10,293,454 B2 | 5/2019 | Nakayama et al. | |
| 2004/0137829 A1 | 7/2004 | Park et al. | |
| 2009/0258574 A1 | 10/2009 | Yilmaz et al. | |
| 2011/0256812 A1 | 10/2011 | Dhandapani et al. | |
| 2012/0322345 A1 | 12/2012 | Rangarajan et al. | |
| 2014/0273765 A1 | 9/2014 | Chang et al. | |
| 2020/0009703 A1 | 1/2020 | Joo et al. | |

* cited by examiner

*Primary Examiner* — Eric J Rosen
*Assistant Examiner* — Tyler James McFarland
(74) *Attorney, Agent, or Firm* — Slater Matsil, LLP (57) ABSTRACT

A method includes placing a polisher head on platen, the polisher head including a set of first magnets, and controlling a set of second magnets to rotate the polisher head on the platen, wherein controlling the set of second magnets includes reversing the polarity of at least one second magnet of the set of second magnets to produce a magnetic force on at least one first magnet of the set of first magnets, wherein the set of second magnets are external to the polisher head.

20 Claims, 11 Drawing Sheets

CHEMICAL MECHANICAL POLISHING APPARATUS AND METHOD

PRIORITY CLAIM AND CROSS-REFERENCE

This application is a divisional of U.S. patent application Ser. No. 16/572,895, filed on Sep. 17, 2019, which application is hereby incorporated herein by reference.

BACKGROUND

Generally, semiconductor devices comprise active components, such as transistors, formed on a substrate. Any number of interconnect layers may be formed over the substrate connecting the active components to each other and to outside devices. The interconnect layers are typically made of low-k dielectric materials comprising metallic trenches/vias.

As the layers of a device are formed, it is sometimes desirable to planarize the device. For example, the formation of metallic features in the substrate or in a metal layer may cause uneven topography. This uneven topography creates difficulties in the formation of subsequent layers. For example, uneven topography may interfere with the photolithographic process used to form various features in a device. It is, therefore, desirable to planarize the surface of the device after various features or layers are formed. One method of planarization is chemical mechanical polishing (CMP).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described with respect to a specific context, namely a chemical mechanical polishing (CMP) apparatus and a method of polishing a semiconductor wafer using the CMP apparatus. Various embodiments include using magnets within a polisher head and stator magnets to move the polisher head during a CMP process. The stator magnets may be located, for example, within the platen or external to the platen. The polarity and strength of the stator magnets may be controlled to rotate the polisher head. By using magnetic interaction to move the polisher head, polishing uniformity may be improved. Additionally, maintenance cost of a CMP apparatus may be reduced.

Figure 1:
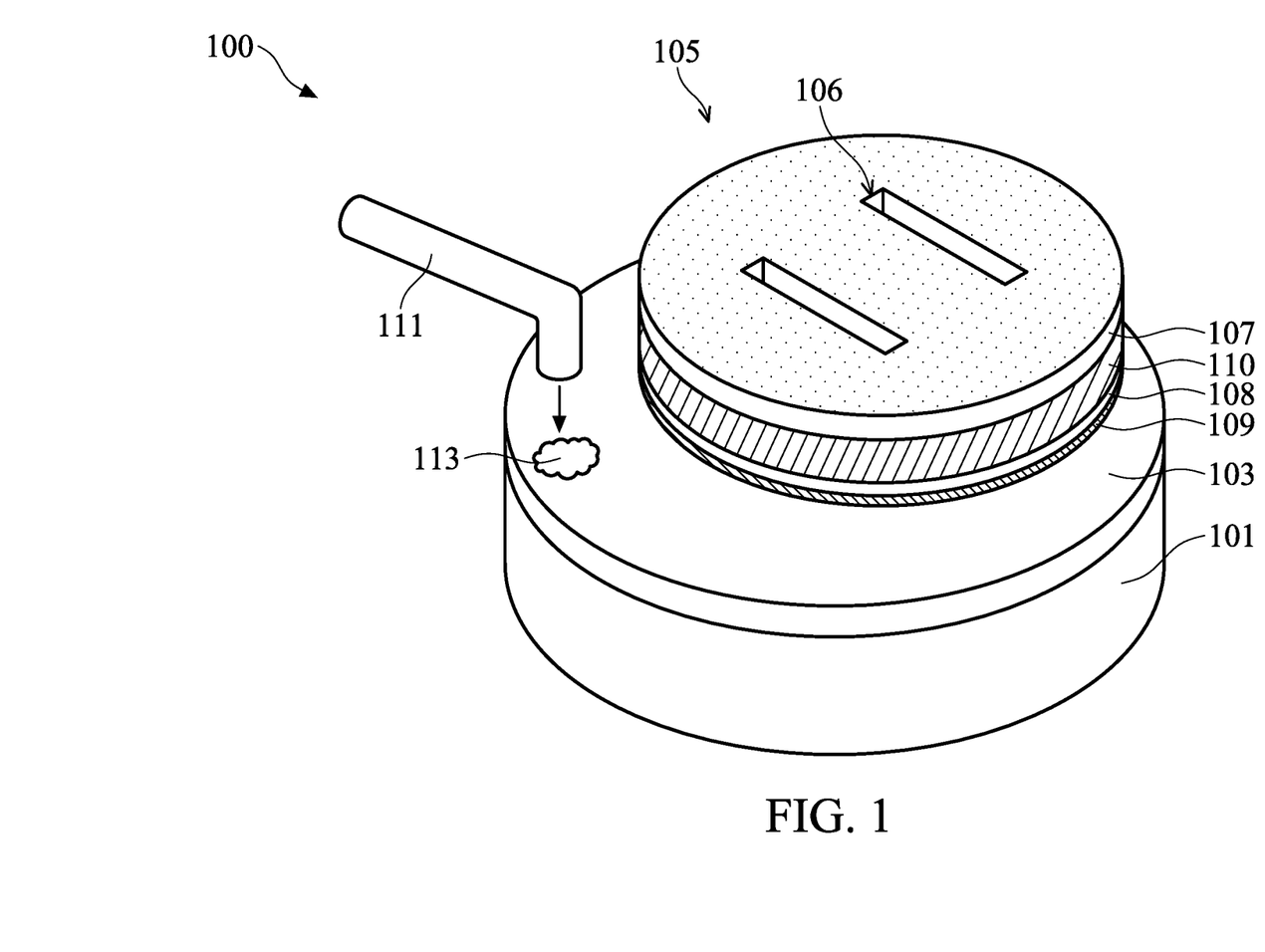
FIG. 1 illustrates a perspective view of a CMP apparatus in accordance with some embodiments.
Figure 2:
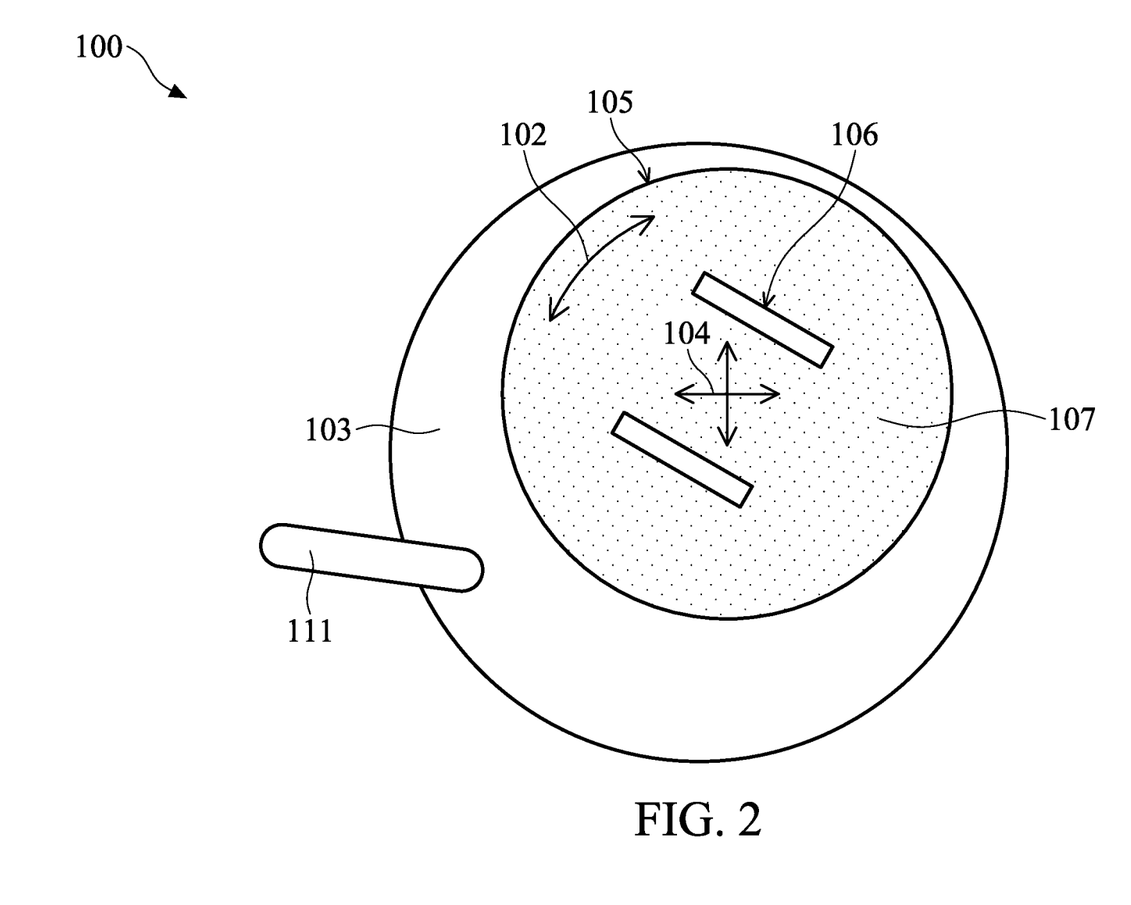
FIG. 2 illustrates a top view of a CMP apparatus in accordance with some embodiments.
Figure 3A:
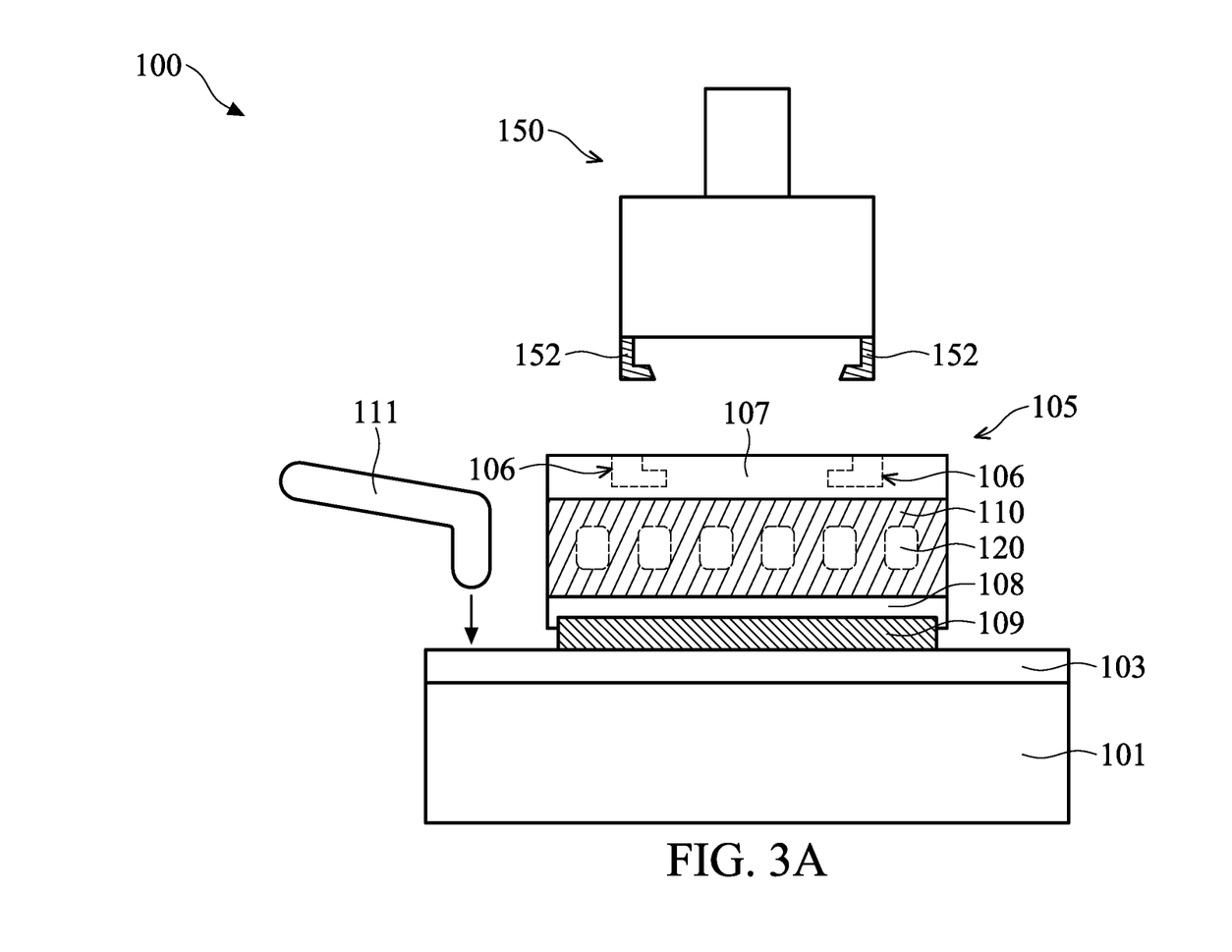
FIGS. 3A-B illustrate side views of a CMP apparatus in accordance with some embodiments.
Figure 3B:
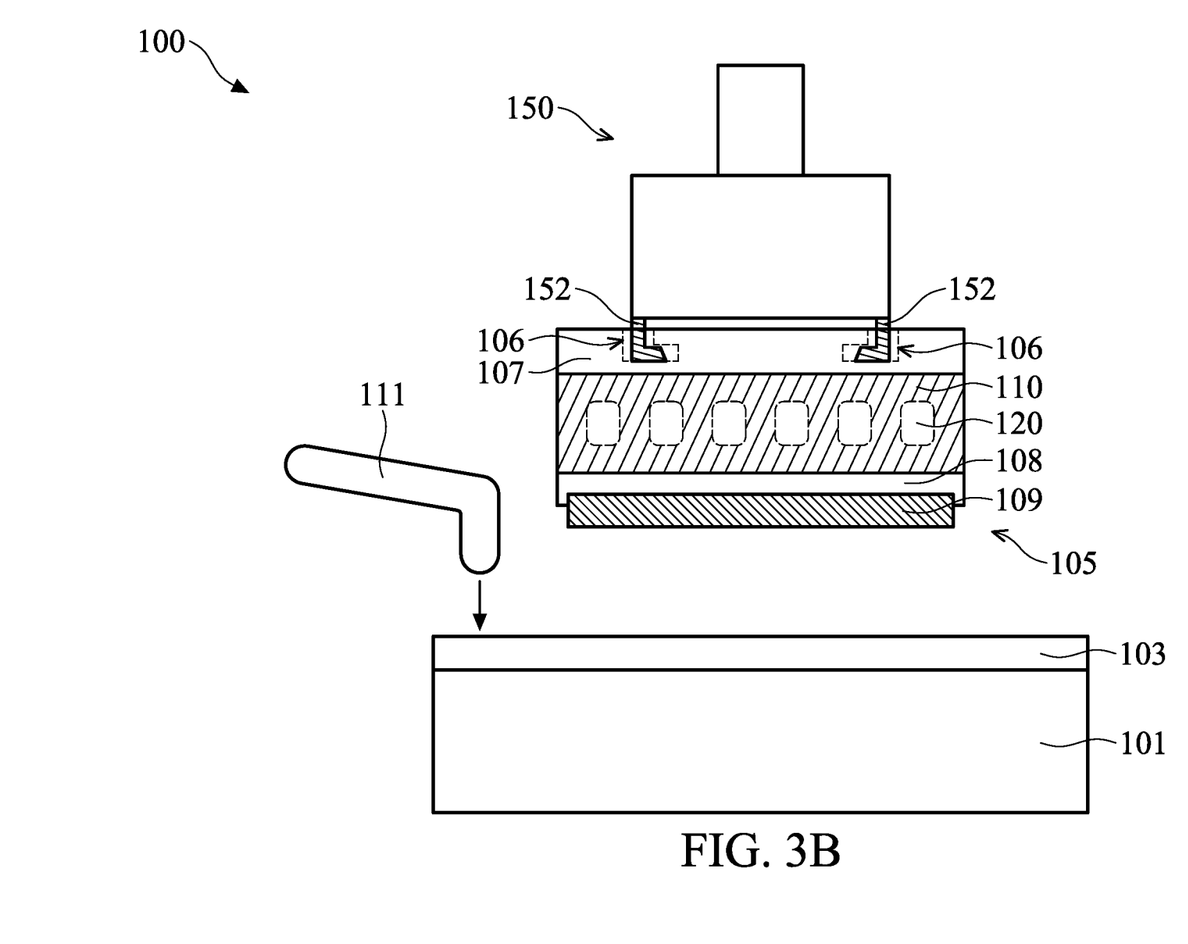
Figure 9:
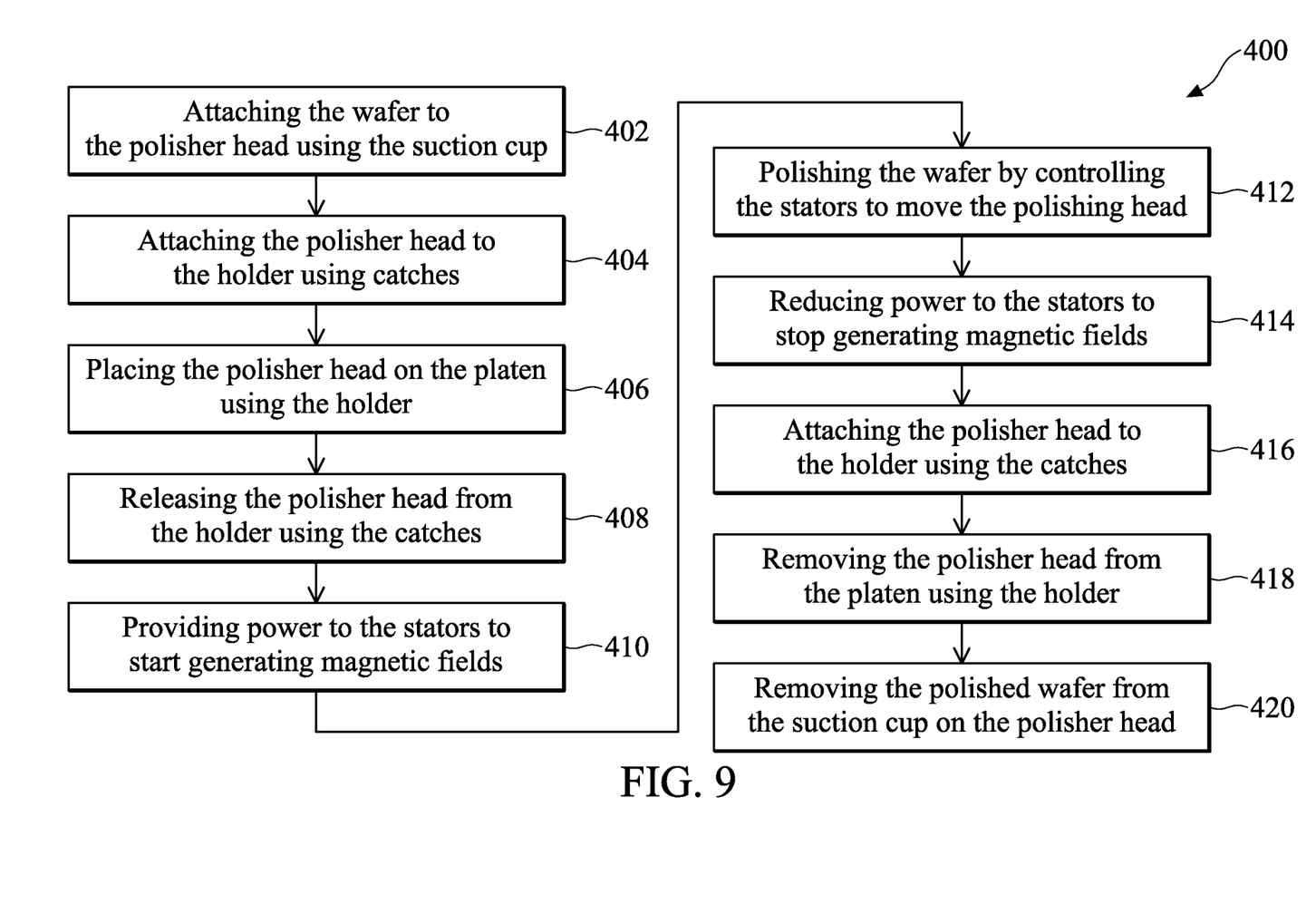
FIG. 9 illustrates a flow chart of a CMP process, in accordance with some embodiments.

FIGS. 1 through 3A-3B illustrate views of a CMP apparatus 100 in accordance with some embodiments. FIG. 1 illustrates a perspective view, FIG. 2 illustrates a plan view, and FIGS. 3A-3B illustrate a side view. The illustrations shown in FIGS. 1 through FIGS. 3A-3B are also reflected schematically in the process flow 400 shown in FIG. 9.

In some embodiments, the CMP apparatus 100 includes a platen 101 over which a polishing pad 103 has been placed. In some embodiments, the polishing pad 103 may be a single layer or a composite layer of materials such as felts, polymer impregnated felts, microporous polymers films, microporous synthetic leathers, filled polymer films, unfilled textured polymer films, or the like. The polymers may include polyurethane, polyolefins, or the like.

In some embodiments, a polisher head 105 is placed over the polishing pad 103. The polisher head 105 includes a carrier 107, a magnetic base 110, and a suction cup 108. The carrier 107 includes one or more catch holes 106 to facilitate placing of the polisher head 105 by a holder 150, described in greater detail below in FIGS. 3A-B. During a CMP process, a wafer 109 is attached to the polisher head 105 using the suction cup 108. The respective step is illustrated as step 402 in the process flow 400 shown in FIG. 9. The suction cup 108 may be, for example, a flexible membrane that uses a pressure differential to securely hold the wafer 109. The suction cup 108 may be used by, for example, generating a pressure differential by pressing the wafer 109 and the suction cup 108 together to expel air from the volume enclosed by the wafer and the suction cup 108. In some embodiments, an adhesive (e.g., a glue or the like) may be used instead of the suction cup 108 or in addition to the suction cup 108 to attach the wafer 109 to the polisher head 105. The wafer 109 is positioned so that the surface to be polished faces downward towards the polishing pad 103.

The magnetic base 110 of the polisher head 105 includes multiple magnets 120 that are configured to interact with stator magnets (e.g., stators 130 or stators 330, described below in FIGS. 4 and 6, respectively) in order to apply a downward force or pressure on the wafer 109 when the wafer 109 is in contact with the polishing pad 103. The magnetic base 110 is also configured to interact with stator magnets to translate or rotate the polisher head 105 during a CMP process. In some embodiments, the polisher head 105 is freestanding (e.g., not mechanically attached to another component) during a CMP process.

In some embodiments, the CMP apparatus 100 includes a slurry dispenser 111, which is configured to deposit a slurry 113 onto the polishing pad 103. In some embodiments, the platen 101 is configured to rotate, which can cause the slurry 113 to be distributed between the wafer 109 and the polishing pad 103. In some embodiments, the platen 101 remains fixed during a CMP process. The composition of the slurry 113 depends on a type of material to be polished. For example, the slurry may comprise a reactant, an abrasive, a surfactant, and/or a solvent. The reactant may be a chemical, such as an oxidizer or a hydrolyzer, which will chemically react with a material of the wafer 109 in order to assist the polishing pad 103 in grinding away the material. In some embodiments in which the material is tungsten, the reactant may be hydrogen peroxide, although any other suitable reactant, such as hydroxylamine, periodic acid, ammonium persulfate, other periodates, iodates, peroxomonosulfates, peroxymonosulfuric acid, perborates, malonamide, combinations of these, and the like, that will aid in the removal of the material may alternatively be utilized. For example, tungsten may be deposited as part of a replacement gate process in which the replacement gate comprises tungsten, and a CMP process such as described herein may be used to remove excess tungsten and/or planarize the tungsten. Other reactants may be used in order to remove other materials. For example, in some embodiments in which the material is an oxide, the reactant may comprise $HNO_3$, $KOH$, $NH_4OH$, or the like. For example, an oxide may be deposited to form a shallow trench isolation (STI) region, an inter-layer dielectric (ILD) region, an inter-metal dielectric (IMD) region, or the like, and a CMP process such as described herein may be used to remove excess oxide and/or planarize the oxide.

The abrasive may be any suitable particulate that, in conjunction with the polishing pad 103, aids in the polishing of the wafer 109. In some embodiments, the abrasive may comprise silica, aluminum oxide, cerium oxide, polycrystalline diamond, polymer particles such as polymethacrylate or polymethacryclic, combinations of these, or the like.

The surfactant may be utilized to help disperse the reactant and abrasive within the slurry 113 and to prevent (or at least reduce) the abrasive from agglomerating during a CMP process. In some embodiments, the surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations of these, or the like. However, these embodiments are not intended to be limited to these surfactants, as any suitable surfactant may alternatively be utilized as the surfactant.

The remainder of the slurry 113 may be a solvent that may be utilized to combine the reactant, the abrasive, and/or the surfactant and allow the mixture to be moved and dispersed onto the polishing pad 103. In some embodiments, the solvent of the slurry 113 may be a solvent such as deionized (DI) water or an alcohol. However, any other suitable solvent may alternatively be utilized.

Referring to further to FIG. 1, in the illustrated embodiment, the CMP apparatus 100 has a single polisher head (such as the polisher head 105) and a single polishing pad (such as the polishing pad 103). However, in other embodiments, the CMP apparatus 100 may have multiple polisher heads and/or multiple polishing pads. In some embodiments in which the CMP apparatus 100 has multiple polisher heads and a single polishing pad, multiple wafers may be polished at the same time. In other embodiments in which the CMP apparatus 100 has a single polisher head and multiple polishing pads, a CMP process may be a multi-step process. In such embodiments, a first polishing pad may be used for bulk material removal from a wafer, a second polishing pad may be used for global planarization of the wafer and a third polishing pad may be used to buff a surface of the wafer. In some embodiments, different slurries may be used for different CMP stages. In other embodiments, the same slurry may be used for all CMP stages.

FIG. 2 illustrates a plan view of the CMP apparatus 100 in accordance with some embodiments. In some embodiments, the polisher head 105 is configured to be rotated in a clockwise or a counter-clockwise direction, as indicated by the double-headed arrow 102. In some embodiments, the polisher head 105 is configured to be translated laterally over the surface of the polishing pad 103, as indicated by the double-headed arrows 104. In some embodiments, the polisher head 105 may be rotated and translated simultaneously.

FIGS. 3A-B illustrate side views of the CMP apparatus 100 in accordance with some embodiments. In addition to the platen 101 and polisher head 105 of the CMP apparatus (as shown in FIG. 1 and FIG. 2), FIG. 3A and FIG. 3B show a holder 150 in accordance with some embodiments. The holder 150 holds the polisher head 105 and is used to place the polisher head 105 onto the polishing pad 103 and also may be used to remove the polisher head 105 from the polishing pad 103. FIG. 3A shows the holder 150 when it is not holding the polisher head 105, and FIG. 3B shows the holder 150 when it is holding the polisher head 105. The CMP apparatus 100 may include a holder positioning apparatus (not shown) that is attached to the holder 150 and is configured to raise, lower, translate, rotate, or otherwise position the holder 150.

The holder 150 includes catches 152 configured to fit within catch holes 106 in the carrier 107 of the polisher head 105, as shown in FIG. 3B. The catches 152 are configured to be moved once within the catch holes 106 such that the catches 152 are able to hold the polisher head 105. The respective step is illustrated as step 404 in the process flow 400 shown in FIG. 9. In this manner, the holder 150 can place the polisher head 105 onto the polishing pad 103 and then move the catches 152 to release the polisher head 105 (as shown in FIG. 3A). The respective steps are illustrated as steps 406 and 408 in the process flow 400 shown in FIG. 9. In some embodiments, the wafer 109 is attached to the suction cup 108 while the polisher head 105 is held by the holder 150. To remove the polisher head 105 from the polishing pad 103 (e.g., after the CMP process is completed), the holder 150 may align the catches 152 over the catch holes 106, insert the catches 152 into the catch holes 106, and then lift the polisher head 105 (as shown in FIG. 3B). The respective steps are illustrated as steps 416 and 418 in the process flow 400 shown in FIG. 9.

In this manner, the polisher head 105 may be placed on the polishing pad 103 such that during a CMP process, the polisher head 105 is free to move without being attached to another component of the CMP apparatus 100. In some embodiments, the polisher head 105 is placed on the polishing pad 103 and released by the holder 150 (e.g., by moving the catches 152) prior to rotation of the polisher head 105 by the magnetic fields generated by the stators 130, described in greater detail below. The holder 150 shown in FIGS. 3A-B is an example, and in other embodiments, catches 152 and/or catch holes 106 may be more or fewer than shown in FIG. 1, 2, or 3A-B and may have other shapes or configurations.

Figure 4:
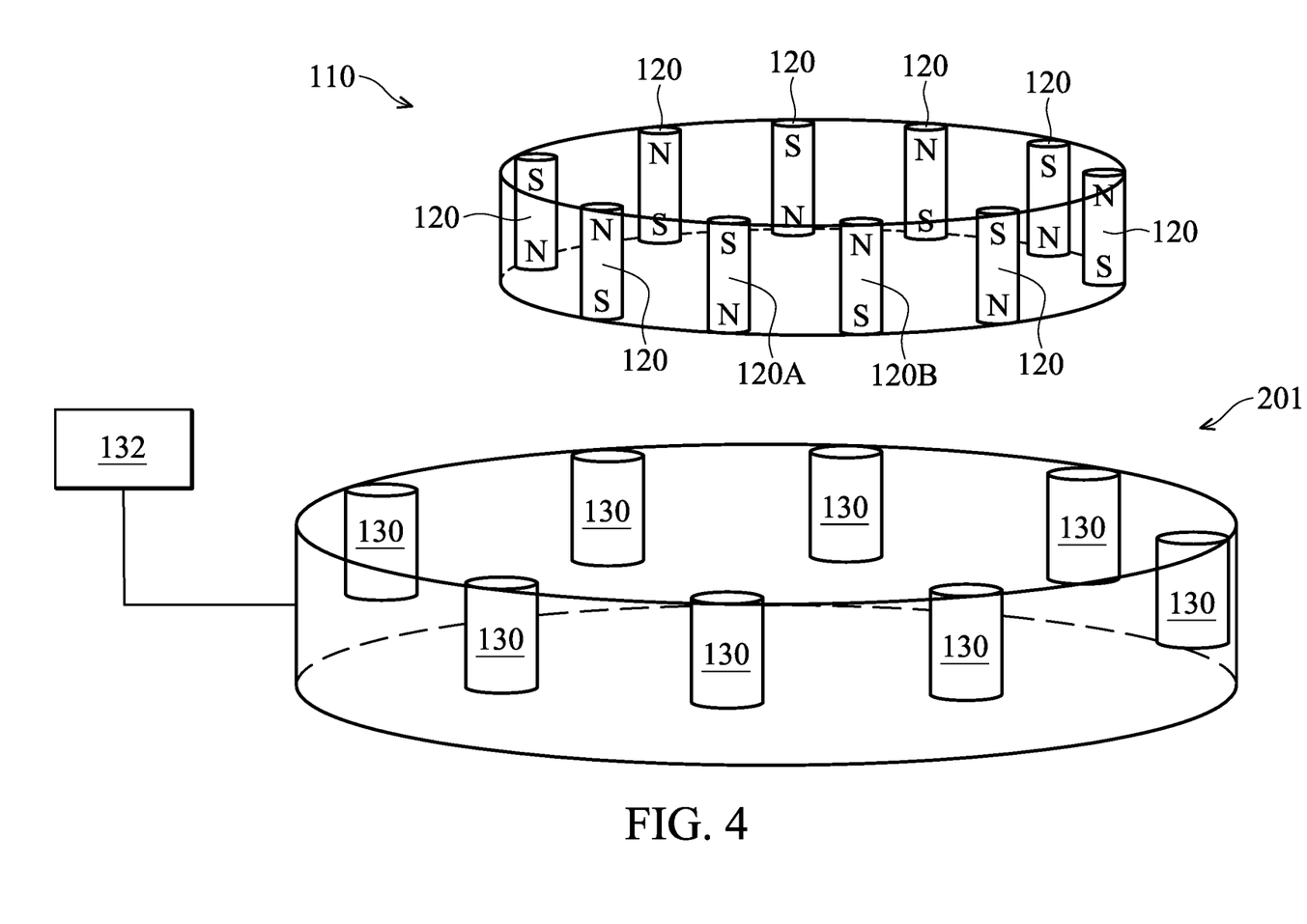
FIG. 4 illustrates components of a CMP apparatus in accordance with some embodiments.

Turning to FIG. 4, a magnetic base 110 and a platen 201 are shown, in accordance with some embodiments. The magnetic base 110 and platen 201 shown in FIG. 4 may be part of a CMP apparatus such as CMP apparatus 100 shown in FIGS. 1 through 3A-B or CMP apparatus 200 shown in FIGS. 5A-B. For clarity, other components of the CMP apparatus are not shown in FIG. 4. The magnetic base 110 may be part of a polisher head 105 similar to those shown in FIGS. 1 through 3A-B, and the platen 201 may be similar to the platen 101 shown in FIGS. 1 through 3A-B.

The magnetic base 110 shown in FIG. 4 includes multiple magnets 120. FIG. 4 illustrates ten magnets 120, but more or fewer magnets 120 may be present in other embodiments. In some embodiments, the magnets 120 are evenly spaced around the perimeter of the magnetic base 110, as shown in FIG. 4, though the magnets 120 may have other arrangements in other embodiments. In some embodiments, the magnets 120 are arranged such that the orientations of adjacent magnets 120 are parallel and have opposite polarity. As an illustrative example, magnet 120A is oriented parallel to the axis of the magnetic base 110, with the north ("N") pole of the magnet 120A toward the bottom of the magnetic base 110 and with the south ("S") pole of the magnet 120A toward the top of the magnetic base 110. The magnet 120B is adjacent the magnet 120A and parallel to the axis of the magnetic base 110 (and thus is also parallel to the magnet 120A), but the south pole of the magnet 120B is toward the bottom of the magnetic base 110 and the north pole of the magnet 120B is toward the top of the magnetic base 110. The magnets 120 may be any suitable magnets, such as permanent magnets (e.g., comprising Ferrite, NdFeB, or the like), electromagnets (e.g., comprising copper wiring around a core or the like), superconducting magnets (e.g., NbTi, (RE)BCO, or the like), other types of magnets, the like, or a combination.

The platen 201 shown in FIG. 4 is similar to the platen 101 shown in FIGS. 1 through 3B, except the platen 201 includes multiple stators 130. The stators 130 are controllable magnets (e.g., electromagnets or the like) disposed within the platen 201. In some embodiments, the stators 130 are stationary with respect to the polisher head 105 during a CMP process, and in some embodiments, the platen 101 and/or the stators 130 rotate during a CMP process. The stators 130 are configured to generate magnetic fields that interact with the magnetic fields of the magnets 120 of the magnetic base 110 in order to move the polisher head 105 (described in greater detail below). FIG. 4 illustrates eight stators 130, but more or fewer stators 130 may be present in other embodiments. The number of stators 130 within the platen 201 may be the same as or different than the number of magnets 120 in the polisher head 105 of the CMP apparatus 100. In some embodiments, the stators 130 are evenly spaced around the perimeter of the platen 201, as shown in FIG. 4, though the stators 130 may have other arrangements in other embodiments. The stators 130 may be oriented parallel to the axis of the platen 201 or parallel to the top surface of the platen 201, or a combination.

In some embodiments, each of the stators 130 within the platen 201 are connected to a controller 132. The controller 132 is configured to control each stator 130 to control its magnetic field strength and/or polarity. For example, the controller 132 can control the electrical power supplied to a stator 130 to increase or decrease the strength of the magnetic fields generated by that stator 130. For example, to begin the CMP process, the controller 132 can provide power to the stators 130 in order to generate magnetic fields using the stators 130. The respective step is illustrated as step 410 in the process flow 400 shown in FIG. 9. In some embodiments, the controller 132 may send signals to a stator 130 that instruct the stator 130 to adjust its magnetic field strength and/or polarity. In some embodiments, a stator 130 may generate a magnetic field having between about 100 Gauss and about 20,000 Gauss, though other magnetic fields are possible. In some cases, generating a stronger magnetic field may allow for a greater pressure to be exerted between the wafer 109 and the polishing pad 103. In this manner, stators 130 that are configured to generate a larger range of magnetic field strengths can allow for more flexibility and control of the polishing pressures used during a CMP process. In some embodiments, the controller 132 can control the polarity of the electrical power (e.g., direction of electrical current or polarity of voltage) supplied to a stator 130 in order to control the polarity of the magnetic fields generated by that stator 130. For example, the controller 132 can control a stator 130 to have either its north pole or its south pole oriented toward one end of the stator 130, and the controller 132 can control the stator 130 to reverse the polarity of the stator 130. In some cases, the polarity of the electrical power may be controlled to have a sinusoidal variation in time.

Figure 5A:
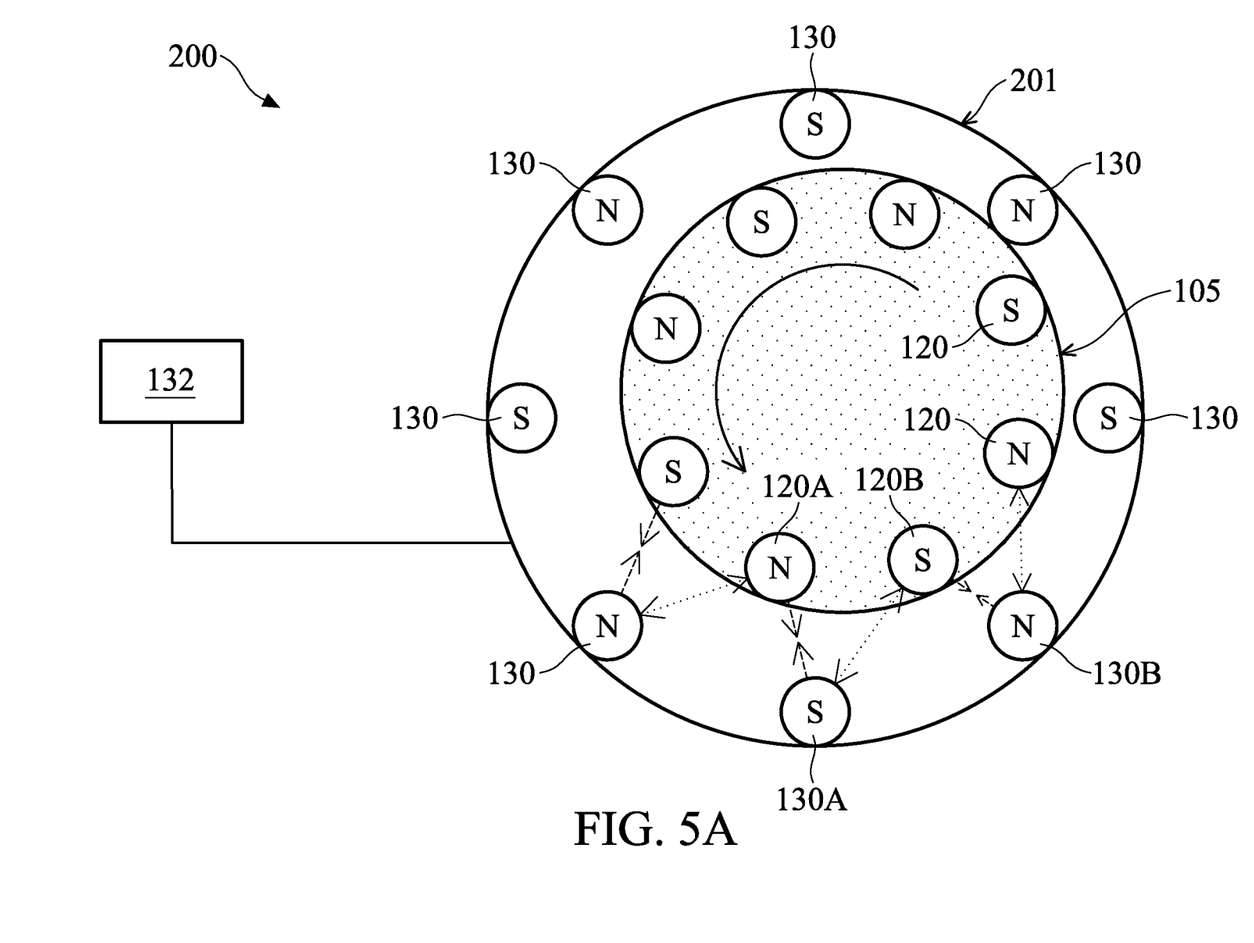
FIGS. 5A-B illustrate top views of a CMP apparatus in accordance with some embodiments.
Figure 5B:
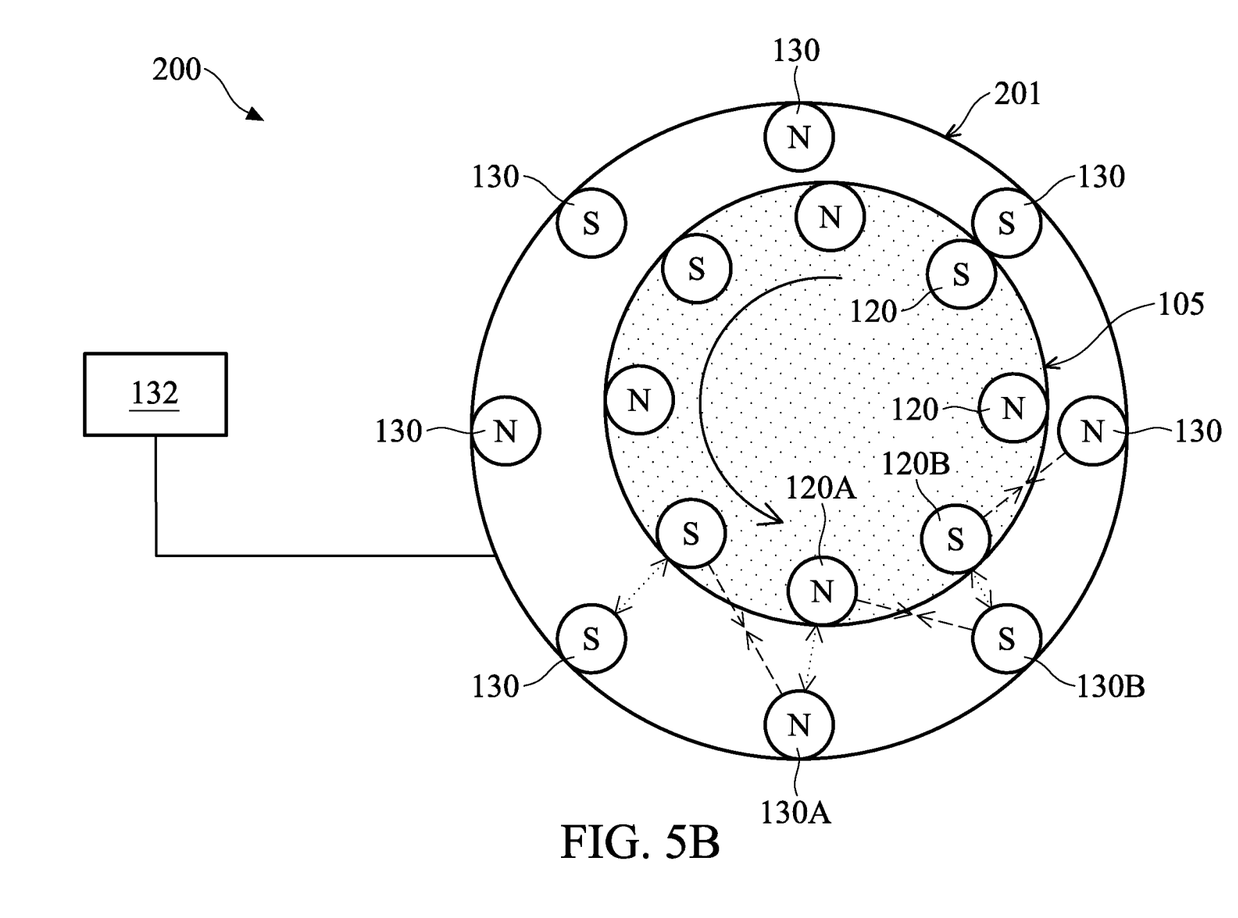

Turning to FIGS. 5A-5B, plan views of an example operation of a CMP apparatus 200 is shown, in accordance with some embodiments. The CMP apparatus 200 may be similar to the CMP apparatus 100 (see FIGS. 1 through 3A-B). The CMP apparatus 200 includes a polisher head 105 that includes a magnetic base 110, which may be similar to the magnetic base 110 described in FIG. 4. The CMP apparatus 200 also includes a platen 201 similar to the platen 201 described in FIG. 4. FIGS. 5A-5B show the polisher head 105 as placed on the polishing pad 103 (not shown in FIGS. 5A-B) during a CMP process, similar to FIGS. 1 and 3A. In FIGS. 5A-5B, the poles of the magnets 120 closest to the platen 201 are labeled as "N" for north and "S" for south, and the poles of the stators 130 closest to the polisher head 105 are also labeled. For example, as shown in FIGS. 5A-5B, the magnet 120A has its north pole oriented toward the bottom of the magnetic base 110, and the magnet 120B has its south pole oriented toward the bottom of the magnetic base 110, similar to magnet 120A and magnet 120B shown in FIG. 4. The illustrations shown in FIGS. 5A-5B are also reflected schematically in the process flow 400 shown in FIG. 9.

In FIGS. 5A-5B, the strength and polarity of the stators 130 are controlled (e.g., by controller 132) to translate and rotate the polisher head 105 using the interaction (e.g., attraction or repulsion) between the magnetic fields of the stators 130 and the magnetic fields of the magnets 120. The strength and polarity of the stators 130 may be controlled based on the position or orientation of the polisher head 105 in order to move the polisher head 105. For example, in FIG. 5A, the polarity of stator 130A is controlled such that the south pole of stator 130A is oriented toward the top of the platen 201, and the polarity of stator 130B is controlled such that the north pole of stator 130A is oriented toward the top of the platen 201.

After the polisher head 105 has been placed on the polishing pad 103 and released by the holder 150 (e.g., steps 404 and 406 in FIG. 9), the controller 132 may be used to control the magnetic fields of the stators 130 to polish the wafer 109 by rotating and/or translating the polisher head 105 on the polishing pad 103. The respective step is illustrated as step 412 in the process flow 400 shown in FIG. 9. Because the polisher head 105 is freestanding after being released by the holder 150, the polisher head 105 may be rotated or translated on the polishing pad 103 without limitations imposed by mechanical linkages, wires, tubes, etc. In some embodiments, to rotate the polisher head 105, the controller 132 may repeatedly reverse the polarities of the stators 130. For example, the controller 132 may supply alternating currents to the stators 130, the alternating currents having appropriate frequencies to produce the desired rotation. At the moment shown in FIG. 5A, the south pole of stator 130A attracts the north pole of magnet 120A and repels the south pole of magnet 120B. The north pole of stator 130B also attracts the south pole of magnet 120B. Similarly, other stators 130 attract or repel corresponding nearby magnets 120. This interaction between the magnets 120 within the polisher head 105 and the stators 130 that surround the polisher head 105 causes the polisher head 105 to rotate. Turning to FIG. 5B, the polisher head 105 has been rotated, and the controller 132 has reversed the polarity of the stators 130. The controller 132 reverses the polarity of the stators 130 to maintain the rotation of the polisher head 105. For example, in FIG. 5B, the polarity of stator 130A has been reversed, and the north pole of stator 130A repels the north pole of magnet 130A. The polarity of stator 130B has been reversed, and the south pole of stator 130B attracts the north pole of magnet 130A and repels the south pole of magnet 120A. The polarity of the stators 130 may be subsequently reversed to continue rotating the polisher head 105. In this manner, the polisher head 105 can be rotated during a CMP process.

In FIGS. 5A-5B, the polisher head 105 is rotated in a counter-clockwise direction, but in other cases the polisher head 105 may be rotated in a clockwise direction or may maintain a fixed angular position. In some embodiments, the controller 132 may not reverse the polarity of all of the stators 130 simultaneously during a CMP process. In some embodiments, the controller 132 may activate or deactivate some stators 130 during a CMP process to translate or rotate the polisher head 105. In some cases, the controller 132 may control the stators 130 to increase or decrease the speed of rotation. The polisher head 105 may be rotated about a fixed axis or may be rotated about a moving axis. In some embodiments, the polisher head 105 may be rotated at a speed between about 0 RPM and about 1000 RPM. By controlling the rotation speed, some characteristics of the CMP process may be controlled, such as the material removal rate. Thus, the use of magnetic fields generated by stators 130 as described can allow for greater flexibility and dynamic control of the CMP process. Additionally, FIGS. 5A-B illustrate the polisher head 105 as being off-centered from the platen 201, but in other cases the polisher head 105 may be maintained approximately centered on the platen 201.

In some embodiments, the controller 132 may reduce or cease powering the stators 130 to stop the polisher head 105 from moving. For example, after the wafer 109 has been sufficiently polished, the stators 130 may be controlled in this manner to stop further polishing due to movement of the polisher head 105. The respective step is illustrated as step 414 in the process flow 400 shown in FIG. 9. The holder 150 may then be controlled to remove the polisher head 105 from the polishing pad 103 by aligning the catches 152 over the catch holes 106, inserting the catches 152 into the catch holes 106, and then lifting the polisher head 105 from the polishing pad 103. The respective steps are illustrated as steps 416 and 418 in the process flow 400 shown in FIG. 9. In some embodiments, the stators 130 may be controlled to position the polisher head 105 at a particular location or orientation on the polishing pad 103 to facilitate removal of the polisher head 105 by the holder 150. After removing the polisher head 105 from the polishing pad 103, the wafer 109 may be released from the suction cup 108. The respective step is illustrated as step 420 in the process flow 400 shown in FIG. 9. In some cases, the polisher head 105 may be released from the holder 150 prior to releasing the wafer 109 from the suction cup 108.

In addition to the lateral forces that rotate the polisher head 105, the interaction between the magnetic fields of the magnets 120 and the magnetic fields of the stators 130 to can be controlled to produce vertical forces on the polisher head 105 that press the wafer 109 into the polishing pad 103. For example, the controller 132 may control the strength of the magnetic fields of the stators 130 such that the vertical component of the attractive forces between the magnets 120 and the stators 130 are greater than the vertical component of the repulsive forces between the magnets 120 and the stators 130. For example, the polarity and strength of each stator 130 may be controlled to increase the attractive forces exerted by stators 130 that are close to magnets 120 of opposite polarity by increasing the strength of those stators' 130 magnetic fields and to decrease the repulsive forces exerted by stators 130 that are close to magnets 120 of the same polarity by decreasing the strength of those stators' 130 magnetic fields. In some embodiments, the stators 130 may be controlled to provide a pressure of the wafer 109 against the polishing pad 103 that is between about 0 psi and about 10 psi. By controlling the pressure, some characteristics of the CMP process may be controlled, such as the material removal rate. Thus, the use of magnetic fields generated by stators 130 as described can allow for greater flexibility and dynamic control of the CMP process.

In this manner, the interaction of the magnets 120 in the polisher head 105 and the stators 130 in the platen 201 can be controlled to polish the wafer 109 during a CMP process. By the use of magnets to move a freestanding polisher head 105 during a CMP process, there may be less chance of mechanical or electrical failure than if the polisher head 105 were moved by a mechanism during a CMP process. In some cases, maintenance costs may also be relatively lower. Additionally, the magnetic fields generated by the stators 130 can be controlled to generate uniform pressure between the wafer 109 and the polishing pad 103. In some cases, the wafer 109 can be maintained at a more parallel orientation with respect to the polishing pad 103, reducing uneven polishing of the wafer 109.

Figure 6:
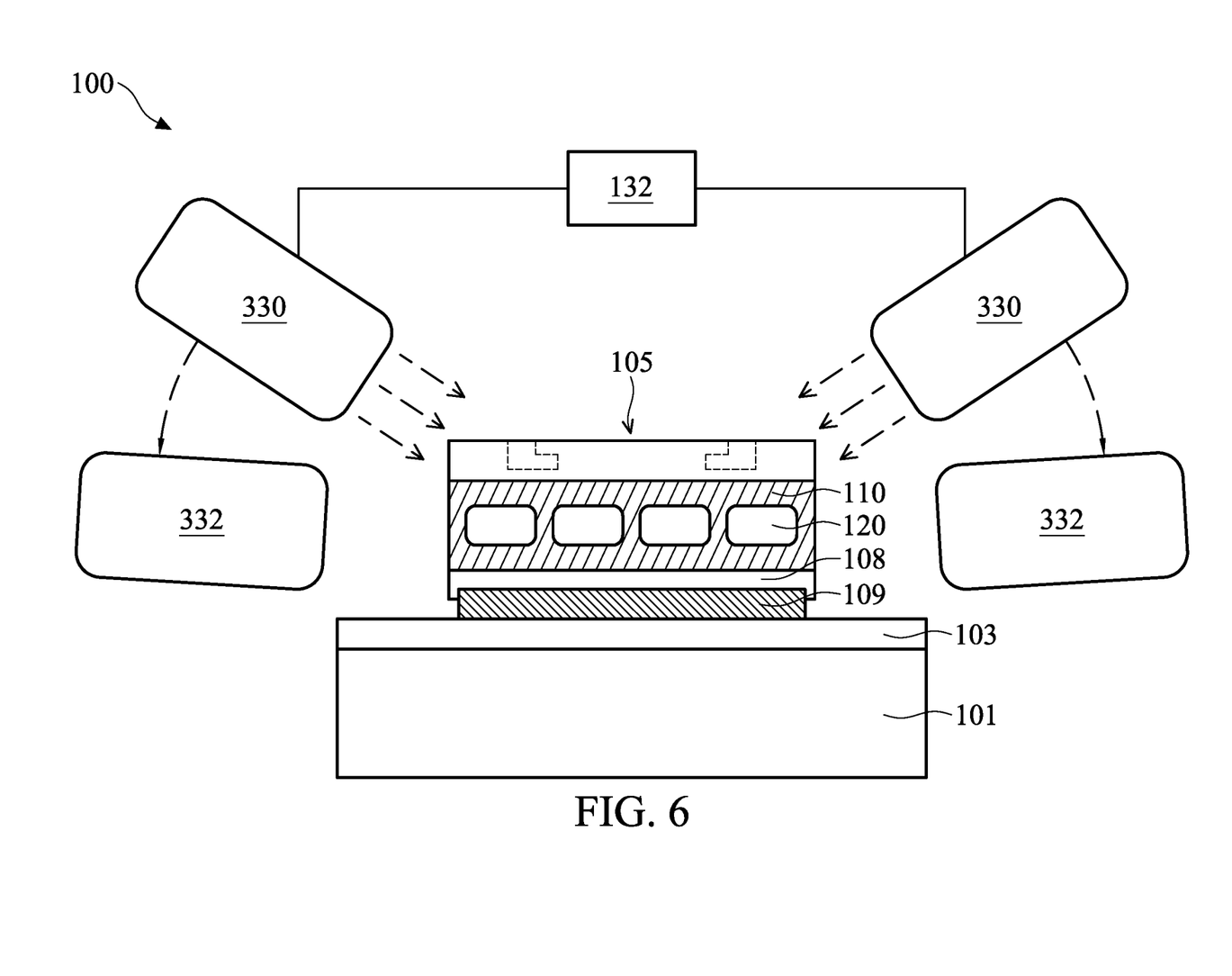
FIG. 6 illustrates a side view of a CMP apparatus in accordance with some embodiments.

Turning to FIG. 6, a CMP apparatus 300 is shown, in accordance with some embodiments. The CMP apparatus 300 may be similar to the CMP apparatus 100 (see FIGS. 1 through 3A-3B) or CMP apparatus 200 (see FIGS. 5A-5B), except the CMP apparatus 300 includes stators 330 that are external to the platen 101. The CMP apparatus 300 includes a polisher head 105 that includes a magnetic base 110, which may be similar to the magnetic base 110 described in FIG. 4 or may be similar to the magnetic base 110 described below in FIG. 7. FIG. 6 shows the polisher head 105 as placed on the polishing pad 103 during a CMP process, similar to FIGS. 1 and 3A. The illustration shown in FIG. 6 is also reflected schematically in the process flow 400 shown in FIG. 9.

Still referring to FIG. 6, the stators 330 are attached to the CMP apparatus 300 such that they are laterally separated from the polisher head 105 and the platen 101. The stators 330 surround the polisher head 105 and are configured to generate magnetic fields that interact with the magnetic fields of the magnets 120 of the magnetic base 110 in order to move the polisher head 105 (described in greater detail below). In some embodiments, the stators 330 are stationary with respect to the polisher head 105 during a CMP process. In some embodiments, each of the stators 330 are connected to a controller 132, which may be similar to the controller 132 described previously in FIG. 4. The controller 132 is configured to control each stator 330 to control its magnetic field strength and/or polarity. In some embodiments, the controller 132 may send signals to a stator 330 that instruct the stator 330 to adjust its magnetic field strength and/or polarity. In some embodiments, a stator 330 may generate a magnetic field having between about 100 Gauss and about 20,000 Gauss. In some cases, generating a stronger magnetic field may allow for a greater pressure to be exerted between the wafer 109 and the polishing pad 103, or to increase the rotational/translational forces exerted on the polishing head 105. In this manner, stators 330 that are configured to generate a larger range of magnetic field strengths can allow for more flexibility and control of the polishing pressures or polishing head 105 movement during a CMP process. In some embodiments, the controller 132 can control the polarity of the electrical power (e.g., direction of electrical current or polarity of voltage) supplied to a stator 330 in order to control the polarity of the magnetic fields generated by that stator 330. For example, the controller 132 can control a stator 330 to have either its north pole or its south pole oriented toward one end of the stator 330, and the controller 132 can control the stator 330 to reverse the polarity of the stator 330.

In some embodiments, the stators 330 are configured to be repositioned in order to control the interaction between the magnetic fields of the stators 330 and the magnetic fields of the polisher head 105. For example, a stator 330 may be brought closer to the polisher head 105 to increase the strength of the magnetic field of the stator 330 that interacts with the polisher head 105. As another example, a stator 330 may be tilted to change the relative strengths of the horizontal component and vertical component of the magnetic field of the stator 330 that interacts with the polisher head 105. For example, the stators 330 may be tilted to an angle between about 0 degrees and about 90 degrees with respect to the plane of the platen 101. A more vertical angle (e.g., closer to 90 degrees) may impart a stronger vertical component of the magnetic field relative to the horizontal component, and a more horizontal angle (e.g., closer to 0 degrees) may impart a stronger horizontal component of the magnetic field relative to the vertical component. By adjusting the location and/or tilt of the stators 330 in this manner, the movement of the polisher head 105 may be controlled during a CMP process.

In some embodiments, the repositioning of the stators 330 may be controlled by the controller 132. For example, the controller 132 may send signals to actuators (not shown) connected to the stators 330 that translate and/or tilt the stators 330. In some embodiments, the stators 330 may be repositioned collectively or repositioned separately. For example, different stators 330 may be positioned at the same relative height or tilt angle, or different stators may be positioned at different relative heights or tilt angles. FIG. 6 shows example repositioning of the stators 330 to positions 332, though stators 330 may be repositioned in other orientations or arrangements. In some embodiments, the positions of individual stators 330 may be adjusted during a CMP process, for example, to impart a greater or lesser magnetic field on a particular region of the polisher head 105. In this manner, the strength and/or position of the stators 330 may be adjusted during a CMP process to maintain a more level polishing, for instance.

Figure 7:
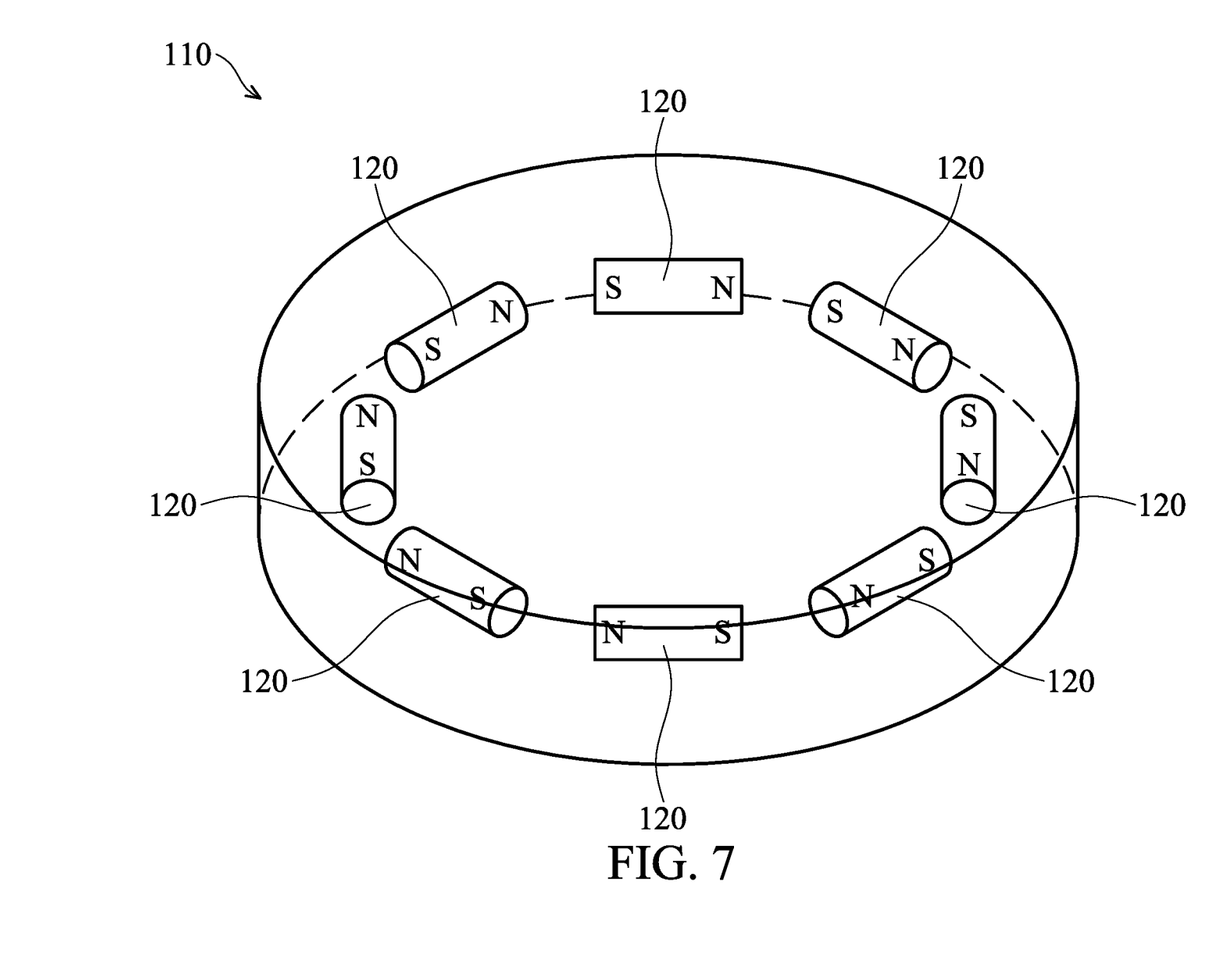
FIG. 7 illustrates a magnetic base of a polisher head in accordance with some embodiments.

Turning to FIG. 7, a magnetic base 110 is shown, in accordance with some embodiments. The magnetic base 110 may be used as part of a polisher head 105 such as that shown in FIG. 6 or 8. The magnetic base 110 is similar to the magnetic base 110 shown in FIG. 4, except for the arrangement of the magnets 120. FIG. 7 illustrates eight magnets 120, but more or fewer magnets 120 may be present in other embodiments. In some embodiments, the magnets 120 are evenly spaced in a single ring around the perimeter of the magnetic base 110, as shown in FIG. 7, though the magnets 120 may have other arrangements or orientations in other embodiments. As shown in FIG. 7, the magnets 120 are arranged such that the magnets 120 are positioned end-to-end in a ring pattern. The magnets 120 are arranged such that the adjacent poles of neighboring magnets are opposite poles (e.g., the north pole of one magnet 120 is adjacent the south pole of a neighboring magnet 120). In this manner, the magnets 120 are arranged laterally within the magnetic base 110, in which all of the magnetic poles of the magnets 120 are approximately coplanar. The magnets 120 may be any suitable magnets, such as those described above in FIG. 4. The illustration shown in FIG. 7 is also reflected schematically in the process flow 400 shown in FIG. 9.

Figure 8:
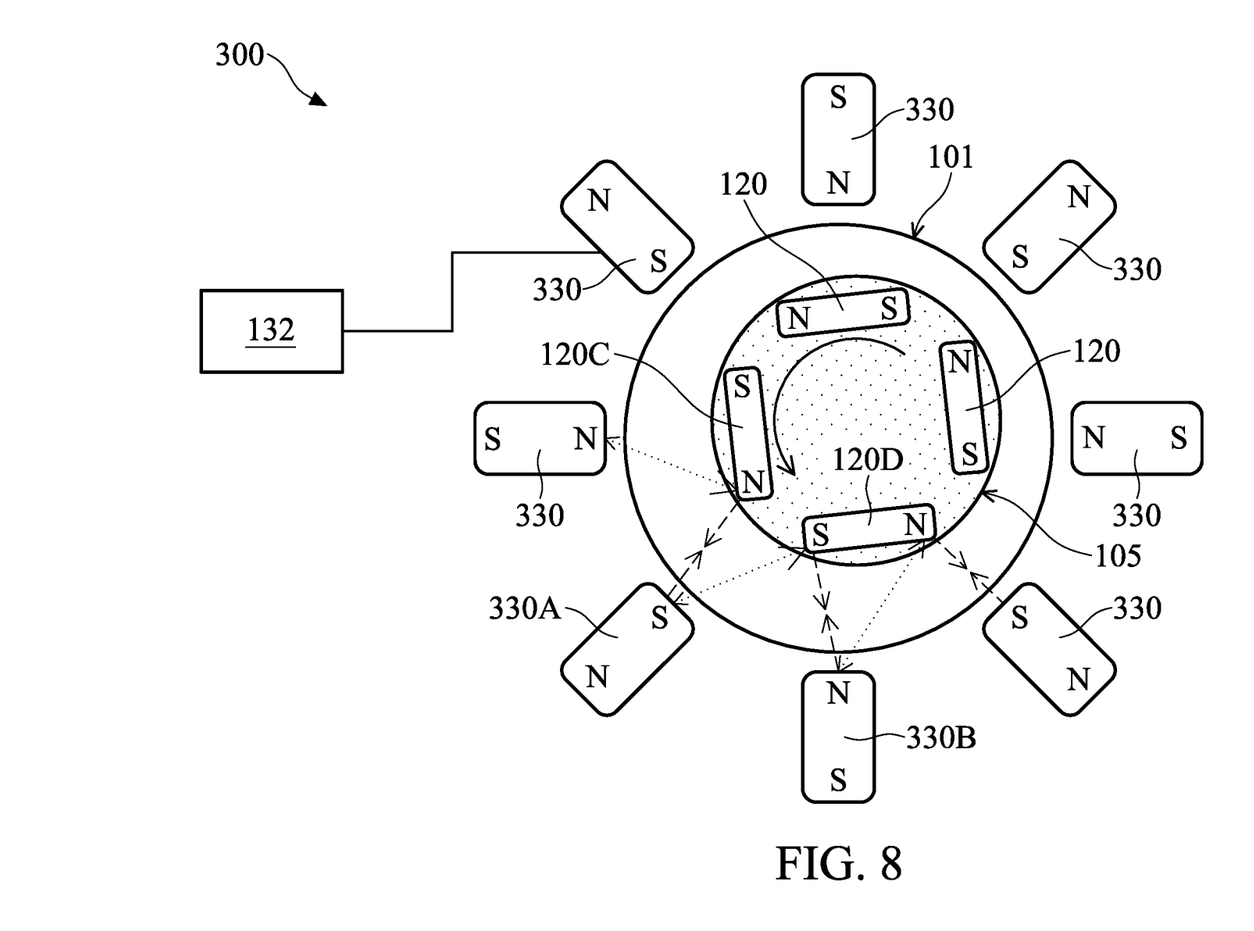
FIG. 8 illustrates a top view of a CMP apparatus in accordance with some embodiments.

Turning to FIG. 8, a plan view of an example operation of a CMP apparatus 300 is shown, in accordance with some embodiments. FIG. 8 shows the polisher head 105 as placed on the polishing pad 103 (not shown in FIG. 8) during a CMP process, similar to FIGS. 5A-B. FIG. 8 illustrates eight stators 330 and a polisher head 105 having four magnets 120, but more or fewer stators 330 or magnets 120 may be present in other embodiments. The number of stators 330 may be the same as or different than the number of magnets 120 in the polisher head 105 of the CMP apparatus 300. FIG. 8 shows the stators 330 as evenly spaced in a circular arrangement surrounding the polisher head 105, but in other embodiments, the stators 130 may not be evenly spaced or may not be in a circular arrangement. The illustration shown in FIG. 8 is also reflected schematically in the process flow 400 shown in FIG. 9.

Referring to FIG. 8, the strength and polarity of the stators 330 are controlled (e.g., by controller 132) to translate and rotate the polisher head 105 using the interaction (e.g., attraction or repulsion) between the magnetic fields of the stators 330 and the magnetic fields of the magnets 120. The movement of the polisher head 105 by the stators 330 shown in FIG. 8 may be similar in operation to the movement of the polisher head 105 by the stators 130 shown in FIGS. 5A-B. For example, at the moment shown in FIG. 8, the south pole of stator 330A attracts the north pole of magnet 120C and repels the south pole of magnet 120D. The north pole of stator 330B also attracts the south pole of magnet 120D and repels the north pole of magnet 120D. Similarly, other stators 330 attract or repel corresponding nearby magnets 120. This interaction between the magnets 120 within the polisher head 105 and the stators 330 that surround the polisher head 105 causes the polisher head 105 to rotate. In some embodiments, to rotate the polisher head 105, the controller 132 may repeatedly reverse the polarities of the stators 330.

In FIG. 8, the polisher head 105 is rotated in a counter-clockwise direction, but in other cases the polisher head 105 may be rotated in a clockwise direction or may maintain a fixed angular position. In some embodiments, the controller 132 may not reverse the polarity of all of the stators 330 simultaneously during a CMP process. In some embodiments, the controller 132 may activate or deactivate some stators 330 during a CMP process to translate or rotate the polisher head 105. In some embodiments, the controller 132 may reposition the stators 330 during a CMP process. In some cases, the controller 132 may control the stators 330 to increase or decrease the speed of rotation. The polisher head 105 may be rotated about a fixed axis or may be rotated about a moving axis. In some embodiments, the polisher head 105 may be rotated at a speed between about 0 RPM and about 1000 RPM. By controlling the rotation speed, some characteristics of the CMP process may be controlled, such as the material removal rate. Thus, the use of magnetic fields generated by stators 330 as described can allow for greater flexibility and dynamic control of the CMP process. Additionally, FIG. 8 illustrates the polisher head 105 as being off-centered from the platen 101, but in other cases the polisher head 105 may be maintained approximately centered on the platen 101. In some embodiments, the platen 101 may be rotated (e.g. by a motor) during the CMP process.

Additionally, the interaction between the magnetic fields of the magnets 120 and the magnetic fields of the stators 330 to can be controlled to produce a vertical force on the polisher head 105 that presses the wafer 109 into the polishing pad 103. For example, the controller 132 may control the strength of the magnetic fields of the stators 330 or the positions of the stators 330 such that the vertical component of the repulsive forces between the magnets 120 and the stators 330 are greater than the vertical component of the attractive forces between the magnets 120 and the stators 330. For example, stators 330 that are closer to magnets 120 of opposite polarity may have their magnetic strength decreased to decrease the attractive forces, and stators that are closer to magnets 120 of the same polarity may have their magnetic strength increased to increase the repulsive forces. In some embodiments, the controller 132 may control the vertical position, lateral position, radial position, or the tilt of the stators 330 in order to control the vertical force on the polisher head 105. In some embodiments, the stators 130 may be controlled to provide a pressure of the wafer 109 against the polishing pad 103 that is between about 0 psi and about 10 psi.

In some cases, the use of magnets to move a polisher head during a CMP process may allow for a more uniform polish. The magnetic interaction can be controlled during the CMP process to both translate and rotate the polisher head. Additionally, the pressure with which the polisher head presses on the polishing pad may be controlled by controlling the magnetic interaction. In some cases, the polishing head may be freestanding and not connected to another component during a CMP process. A holder mechanism may be used to place the polisher head on the polishing pad or remove the polisher head from the polishing pad. In some cases, the polisher head may have no mechanical or electronic components, for example, if the magnets used are permanent magnets, or if the wafer is held in place by a suction cup instead of an actively generated negative pressure. By using magnets to move the polisher head, the number of mechanical or electronic components (e.g., linkages, motors, tubing, bearings, wiring, etc.) in a CMP apparatus may be reduced. By using fewer such components, the likelihood of component breakdown may be reduced, and the cost of component maintenance may also be reduced. The weight or cost of a CMP apparatus may also be reduced.

In an embodiment, a method includes placing a polisher head on platen, the polisher head including a set of first magnets, and controlling a set of second magnets to rotate the polisher head on the platen, wherein controlling the set of second magnets includes reversing the polarity of at least one second magnet of the set of second magnets to produce a magnetic force on at least one first magnet of the set of first magnets, wherein the set of second magnets are external to the polisher head. In an embodiment, the set of second magnets is disposed within the platen. In an embodiment, the set of second magnets is external to the platen. In an embodiment, controlling the set of second magnets further includes vertically translating at least one second magnet of the set of second magnets. In an embodiment, controlling the set of second magnets includes controlling the strength of the magnetic force generated by at least one second magnet of the set of second magnets. In an embodiment, the magnetic force includes a downward force. In an embodiment, the polisher head is placed on the platen by a polisher head holder, and wherein after placing the polisher head on the platen, the polisher head is detached from the polisher head holder. In an embodiment, the polisher head is free of electrical connections to other components. In an embodiment, controlling the set of second magnets includes simultaneously controlling the polarity of each second magnet of the set of second magnets. In an embodiment, the first magnets are oriented laterally within the polisher head.

In an embodiment, a method includes attaching a wafer to a polisher head, wherein the polisher head includes multiple first magnets, placing the polisher head on a platen, wherein the platen includes multiple second magnets, wherein each second magnet includes an electromagnet coupled to a controller, and using the controller, controlling the electrical power delivered to each second magnet to generate magnetic fields that impart lateral forces on the multiple first magnets to rotate the polisher head with respect to the platen. In an embodiment, the multiple first magnets are oriented vertically within the polisher head. In an embodiment, the method further includes controlling the electrical power delivered to each second magnet to generate magnetic fields that impart vertical forces on the multiple first magnets to press the wafer onto the platen. In an embodiment, the wafer is pressed onto the platen with a pressure between 0 psi and 10 psi. In an embodiment, the method further includes controlling the electrical power delivered to each second magnet to generate magnetic fields that impart lateral forces to laterally translate the polisher head. In an embodiment, the polisher head includes a suction cup, and wherein attaching the wafer to the polisher head includes using the suction cup. In an embodiment, after placing the polisher head on the platen, the polisher head is free of mechanical connection to the platen.

In an embodiment, a polishing apparatus includes a polisher head, the polisher head including multiple first magnets, a platen including multiple second magnets, a holder configured to place the polisher head on the platen, wherein the holder is configured to release the polisher head after placing the polisher head on the platen, and a controller coupled to the multiple second magnets, the controller configured to control the polarity of each of the second magnets to rotate the polisher head after the holder has released the polisher head. In an embodiment, the polisher head includes catch holes, and the holder includes catch mechanisms configured to be inserted within the catch holes. In an embodiment, the first magnets include permanent magnets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polishing apparatus comprising:
   a polisher head, the polisher head comprising a plurality of first magnets;
   a platen comprising a plurality of second magnets;
   a holder configured to place the polisher head on the platen, wherein the holder is configured to release the polisher head after placing the polisher head on the platen; and
   a controller coupled to the plurality of second magnets, the controller configured to control a polarity of each of the second magnets to rotate the polisher head after the holder has released the polisher head.

2. The polishing apparatus of claim 1, wherein the polisher head comprises catch holes, and the holder comprises catch mechanisms configured to be inserted within the catch holes.

3. The polishing apparatus of claim 1, wherein the first magnets comprise permanent magnets.

4. The polishing apparatus of claim 1, wherein controlling the plurality of second magnets comprises controlling a strength of the magnetic force generated by at least one second magnet of the plurality of second magnets.

5. The polishing apparatus of claim 1, wherein the magnetic force comprises a downward force.

6. The polishing apparatus of claim 1, wherein the polisher head is free of electrical connections to other components.

7. The polishing apparatus of claim 1, wherein controlling the plurality of second magnets comprises simultaneously controlling a polarity of each second magnet of the plurality of second magnets.

8. The polishing apparatus of claim 1, wherein the first magnets are oriented laterally within the polisher head.

9. A polishing apparatus comprising:
   a polisher head, the polisher head comprising a plurality of first magnets;
   a platen;
   a plurality of second magnets; and
   a controller coupled to the plurality of second magnets, the controller configured to control a polarity of each of the second magnets to rotate the polisher head.

10. The polishing apparatus of claim 9, wherein the plurality of second magnets are positioned within the platen.

11. The polishing apparatus of claim 10, wherein each of the plurality of second magnets are arranged such that an axis between poles of each of the plurality of second magnets are parallel to the axis of the polisher head when the polisher head is placed on the platen.

12. The polishing apparatus of claim 9, wherein the plurality of second magnets are positioned outside of the platen.

13. The polishing apparatus of claim 12, wherein each of the plurality of second magnets are arranged such that a first pole faces the polisher head when the polisher head is placed on the platen and a second pole faces away from the polisher head when the polisher head is placed on the platen.

14. The polishing apparatus of claim 9, wherein the plurality of first magnets are arranged around an axis of the polisher head, wherein the axis is orthogonal to a bottom surface of the polisher head.

15. The polishing apparatus of claim 9, wherein each of the plurality of first magnets are arranged such that an axis between poles of each of the plurality of first magnets is parallel to the axis of the polisher head.

16. The polishing apparatus of claim 9, wherein each of the plurality of first magnets are arranged such that an axis between poles of each of the plurality of first magnets is parallel to a bottom surface of the polisher head.

17. A polishing apparatus comprising:
   a polisher head, the polisher head comprising a plurality of first magnets;
   a platen;
   a plurality of second magnets;
   a holder configured to place the polisher head on the platen, wherein the holder is configured to release the polisher head after placing the polisher head on the platen; and
   a controller coupled to the plurality of second magnets, the controller configured to control rotation of the polisher head by controlling a magnetic field generated by the plurality of second magnets.

18. The polishing apparatus of claim 17, wherein the plurality of second magnets are positioned within the platen.

19. The polishing apparatus of claim 17, wherein the plurality of second magnets are positioned outside of the platen.

20. The polishing apparatus of claim 17, wherein a first pole of each of the plurality of first magnets faces away from the platen when the polisher head is on the platen.

* * * * *